United States Patent
Teng et al.

(10) Patent No.: US 8,421,439 B2
(45) Date of Patent: Apr. 16, 2013

(54) CURRENT DETECTING AND INDICATING DEVICE

(75) Inventors: Jen-Hao Teng, Kaohsiung County (TW); Shang-Wen Luan, Kaohsiung County (TW); Chao-Shun Chen, Kaohsiung County (TW)

(73) Assignee: I-Shou University, Dashu Township, Kaohsiung County (TW)

( * ) Notice: Subject to any disclaimer, the term of this patent is extended or adjusted under 35 U.S.C. 154(b) by 444 days.

(21) Appl. No.: 12/888,103

(22) Filed: Sep. 22, 2010

(65) Prior Publication Data

US 2011/0309830 A1 Dec. 22, 2011

(30) Foreign Application Priority Data

Jun. 18, 2010 (TW) ................................ 99119903 A

(51) Int. Cl.
*G01R 21/00* (2006.01)
*G01R 19/00* (2006.01)

(52) U.S. Cl.
USPC ................ 324/76.11; 324/103 R; 324/764.01

(58) Field of Classification Search ........................ None
See application file for complete search history.

(56) References Cited

U.S. PATENT DOCUMENTS

| | | | | |
|---|---|---|---|---|
| 4,428,021 A | * | 1/1984 | Chen et al. | 361/94 |
| 4,868,412 A | * | 9/1989 | Owens | 307/141 |
| 5,555,725 A | * | 9/1996 | Shimasaki et al. | 60/277 |
| 6,894,478 B1 | * | 5/2005 | Fenske | 324/127 |
| 7,615,988 B2 | | 11/2009 | Blakely | |
| 2001/0040446 A1 | * | 11/2001 | Lapinksi et al. | 324/126 |

FOREIGN PATENT DOCUMENTS

| | | |
|---|---|---|
| TW | 517420 | 1/2003 |
| TW | I263050 | 10/2006 |

\* cited by examiner

*Primary Examiner* — Vinh Nguyen
(74) *Attorney, Agent, or Firm* — Muncy, Geissler, Olds & Lowe, PLLC

(57) ABSTRACT

A current detecting and indicating device includes a detection unit and a display unit. The detection unit has a power module, a current detecting module, a multiplexer module and a transmission module. The power module includes positive and negative electrodes. The current detecting module includes a plurality of upper-limit switching units and a lower-limit switching unit. Each upper-limit switching unit has two ends coupled to the positive and negative electrodes, and the lower-limit switching unit has two ends coupled to the positive and negative electrodes. The multiplexer module includes a first input port and a first output port. The transmission module includes a micro-controller unit and a transmission device. The micro-controller unit includes a low-level end, a high-level end and a second input port. The second input port is coupled to the first output port. The display unit is coupled to the transmission device for receiving signals therefrom.

14 Claims, 1 Drawing Sheet

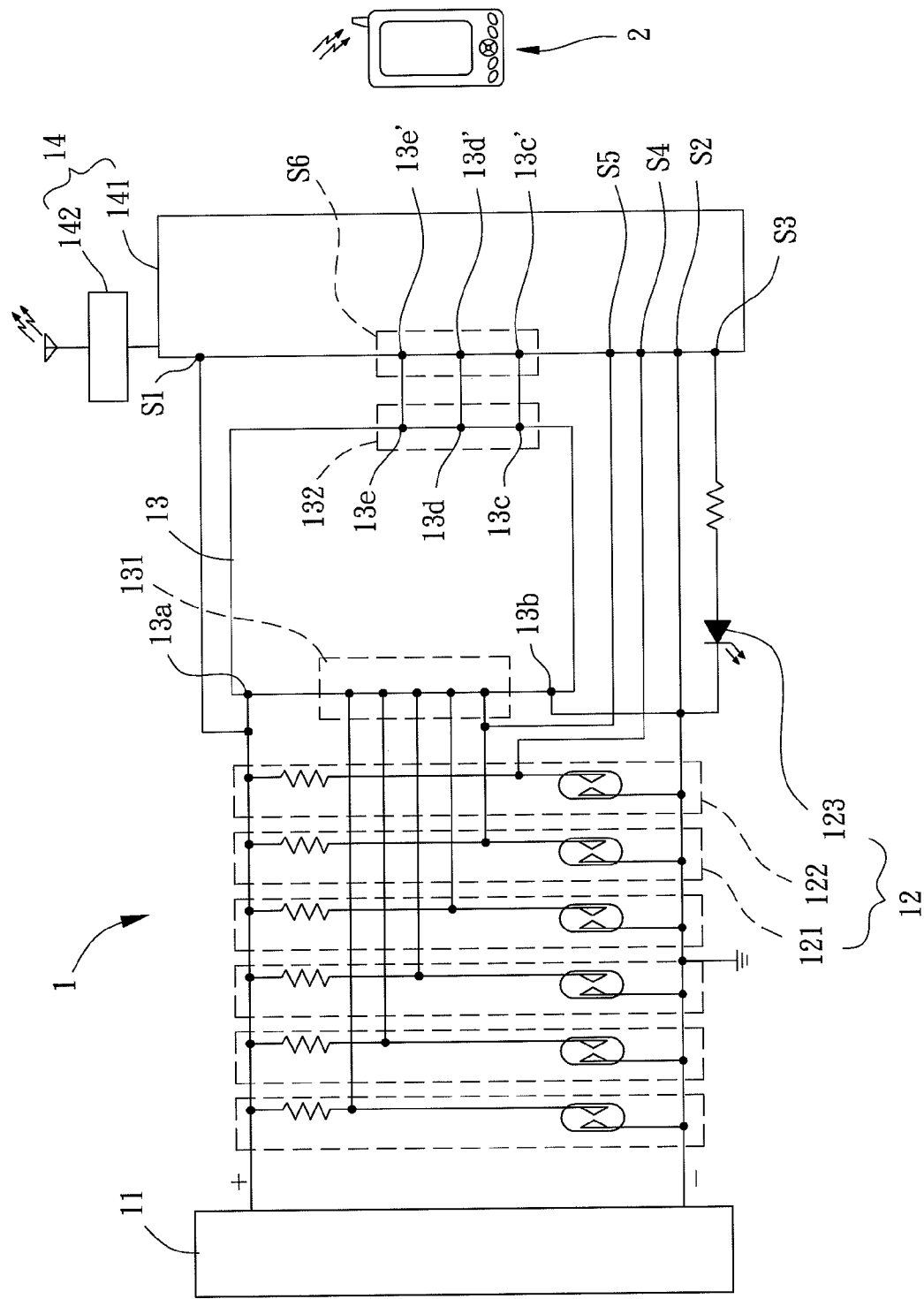

CURRENT DETECTING AND INDICATING DEVICE

BACKGROUND OF THE INVENTION

1. Field of the Invention

The present invention generally relates to a current detecting and indicating device and, more particularly, to a current detecting and indicating device having a plurality of magnetic reed switches with different current levels for detecting abnormal currents of a power distribution system.

2. Description of the Related Art

A conventional current detecting and indicating device is used to detect whether an abnormal current occurs on any part of a power distribution system. The detected result is then provided to a person monitoring the operation condition of the power distribution system. However, the conventional current detecting and indicating device can only show the person which specific part of the power distribution system the abnormal current has taken place rather than showing a magnitude of the abnormal current. To show the specific magnitude of the abnormal current, an expensive current sensor and a high performance micro processor should be used. However, it is not economical to use that many devices in a wide-ranging power distribution system.

Taiwan Patent Numbers 1263050 and 517420 disclose a power distribution system that uses a current transformer, a measurement circuit and a digital display device for detecting an abnormal current. In the power distribution, although the magnitude of the abnormal current may be shown by the digital display device, it is still not economical to use such expensive devices in the wide-ranging power distribution system.

Furthermore, U.S. Pat. No. 7,615,988 discloses a wide range current detecting method and system, which use a plurality of transformer coils for detecting currents by way of induction. In such a mechanism, it is also required to use a current transformer. Besides, the transformer coils also require a measurement circuit and a display device for current detection. Thus, cost is increased.

Therefore, it is desired to improve the conventional current detecting and indicating device.

SUMMARY OF THE INVENTION

It is therefore the primary objective of this invention to provide a current detecting and indicating device having a plurality of magnetic reed switches with different current levels for detecting an abnormal current of a power distribution system. The magnetic reed switches define a plurality of current ranges in order to determine within which current range the abnormal current has fallen.

It is a secondary objective of this invention to provide a current detecting and indicating device which enables a maintenance specialist to monitor the operation condition of a power distribution system and recognize a magnitude of an abnormal current immediately, thereby rapidly obtaining information needed for repair.

It is another objective of this invention to provide a current detecting and indicating device which uses a detection unit to detect a magnitude of an abnormal current, thereby significantly reducing cost.

The invention discloses a current detecting and indicating device for a power distribution system, including a detection unit and a display unit. The detection unit has a power module, a current detecting module, a multiplexer module and a transmission module. The power module includes positive and negative electrodes and is coupled to the current detecting module. The current detecting module includes a plurality of upper-limit switching units and a lower-limit switching unit. Each of the upper-limit switching units has two ends coupled to the positive and negative electrodes, and the lower-limit switching unit has two ends coupled to the positive and negative electrodes. The multiplexer module includes a first input port and a first output port. The first input port is coupled to the upper-limit switching units and the first output port is coupled to the transmission module. The transmission module includes a micro-controller unit and a transmission device coupled to the micro-controller unit. The micro-controller unit includes a low-level end, a high-level end and a second input port. The low-level end is coupled to the lower-limit switching unit and the high-level end is coupled to one of the upper-limit switching units with minimal current level. The second input port is coupled to the first output port. The display unit is coupled to the transmission device for receiving signals therefrom.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

Solo FIGURE shows a current detecting and indicating device of a power distribution system according to a preferred embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings and are utilized only to facilitate describing the invention.

DETAILED DESCRIPTION OF THE INVENTION

Referring to solo FIGURE, a current detecting and indicating device of a power distribution system is disclosed according to a preferred embodiment of the invention. The current detecting and indicating device includes a detection unit 1 and a display unit 2. The detection unit 1 detects whether an abnormal current has occurred in the power distribution system. The detected result is then delivered to the display unit 2 in a wired or wireless manner, enabling a maintenance specialist to monitor the operation condition of the power distribution system based on the detected result received. Thus, operation information of the power distribution system such as magnitude of the detected abnormal current or location where the abnormal current has taken place in the power distribution system may be known by the maintenance specialist, enabling the maintenance specialist to take corresponding measures to fix the problem.

The detection unit 1 includes a power module 11, a current detecting module 12, a multiplexer module 13 and a transmission module 14. The power module 11 includes a positive electrode and a negative electrode.

Both the positive and negative electrodes are connected to the current detecting module 12 to provide the required power thereto. The current detecting module 12 is electrically connected to the multiplexer module 13 and used to detect a current of a detecting point of the power distribution system. The multiplexer module 13 is electrically connected to the transmission module 14. The transmission module 14 passes electronic signals received from the multiplexer module 13 to the display unit 2.

The current detecting module 12 includes a plurality of upper-limit switching units 121, a lower-limit switching unit 122 and a lighting module 123. The lower-limit switching unit 122 is electrically connected to each upper-limit switching unit 121 in parallel. In addition, each upper-limit switching unit 121 has two ends electrically connected to the positive and negative electrodes, respectively. Similarly, the lower-limit switching unit 122 also has two ends electrically connected to the positive and negative electrodes, respectively. Furthermore, each upper-limit switching unit 121 has a standard value. The standard value may define a plurality of current levels for the detecting point of the power distribution system, with a current range being defined by two adjacent current levels. In the embodiment, the current levels of the upper-limit switching units 121 may be preferably categorized as being "minimum", "small", "middle", "large" and "maximum". Based on this, five current ranges are defined, namely, "minimum to small", "small to middle", "middle to large", "large to maximum" and "over maximum". Wherein, the upper-limit switching unit 121 with the minimal current level and the lower-limit switching unit 122 are electrically connected to the transmission module 14. Each upper-limit switching unit 121 preferably consists of a magnetic reed switch and a resistor connected to the magnetic reed switch in series. Similarly, the lower-limit switching unit 122 also consists of a magnetic reed switch and a resistor connected to the magnetic reed switch in series. A node where the magnetic reed switch and the resistor are connected together is connected to the multiplexer module 13. The magnetic reed switch of the upper-limit switching unit 121 is used to set the current level. The magnetic reed switch of the lower-limit switching unit 122 is used to set a minimal restore current value. Based on this, the magnetic reed switch of the upper-limit switching unit 121 is switched on when the current of the detecting point has a magnitude higher than the current level. On the contrary, the magnetic reed switch of the upper-limit switching unit 121 is switched off when the current of the detecting point has a magnitude lower than the standard value. Moreover, the magnetic reed switch of the lower-limit switching unit 122 is switched on when the current of the detecting point has a magnitude higher than the minimal restore current value. On the contrary, the magnetic reed switch of the lower-limit switching unit 122 is switched off when the current of the detecting point has a magnitude lower than the standard value. The lighting module 123 has one end electrically connected to the negative electrode of the power module 11, as well as the other end electrically connected to the transmission module 14. The lighting module 123 is preferably a light emitting diode (LED) or bulb.

The multiplexer module 13 is electrically connected to the transmission module 14. In addition, the multiplexer module 13 has a first positive input end 13a, a first negative input end 13b, a first input port 131 and a first output port 132. The first positive input end 13a is electrically connected to the positive electrode of the power module 11, and the first negative input end 13b is electrically connected to the negative electrode of the power module 11. The first input port 131 includes a plurality of ends respectively connected to the upper-limit switching units 121, enabling the multiplexer module 13 to record switching conditions of the upper-limit switching units 121. Each end of the first input port 131 is preferably connected to the node where the magnetic reed switch and the resistor of one upper-limit switching unit 121 are connected together. The first output port 132 is electrically connected to the transmission module 14. Specifically, the first output port 132 includes an output end 13c, a clock-in end 13d and a control end 13e. The output end 13c, clock-in end 13d and control end 13e are electrically connected to the transmission module 14. The multiplexer module 13 may be chosen as a multiple-bit register according to a current range (magnitude) of the abnormal current to be detected. Preferably, the multiple-bit register is chosen as an 8-bit register.

The transmission module 14 includes a micro-controller unit (MCU) 141 and a transmission device 142. The micro-controller unit 141 includes a second positive input end S1, a second negative input end S2, a light-driving end S3, a low-level end S4, a high-level end S5 and a second input port S6. The second positive input end S1 is electrically connected to the positive electrode of the power module 11, and the second negative input end S2 is electrically connected to the negative electrode of the power module 11. The light-driving end S3 is electrically connected to the lighting module 123. The low-level end S4 is electrically connected to the lower-limit switching unit 122 so that the switching condition of the lower-limit switching unit 122 may be monitored. Preferably, the low-level end S4 is electrically connected to the node where the magnetic reed switch and the resistor of the lower-limit switching unit 122 are connected together. The high-level end S5 is electrically connected to one of the upper-limit switching units 121 so that the switching condition of the upper-limit switching unit 121 may be detected. Preferably, the high-level end S5 is electrically connected to the upper-limit switching unit 121 with minimal current level, with the high-level end S5 being connected to the node where the magnetic reed switch and the resistor of that upper-limit switching unit 121 are connected together. The second input port S6 includes an input end 13c', a clock-out end 13d' and a control end 13e'. The input end 13c' is electrically connected to the output end 13c. The clock-out end 13d' is electrically connected to the clock-in end 13d. The control end 13e' is electrically connected to the control end 13e. The transmission device 142 is electrically connected to the micro-controller unit 141 and transmits wired or wireless signals to the display unit 2 based on signals of the micro-controller unit 141. The transmission device 142 may preferably be a Zigbee, a general packet radio service (GPRS), a global system for mobile communications (GSM), a power line carrier (PLC) or a fiber network. In such wired or wireless transmission manners, the display unit 2 may receive signals from the detection unit 1.

The connections and interactions among the current detecting module 12, multiplexer module 13 and transmission module 14 are described below.

When there occurs an abnormal current with a magnitude greater than the minimal current level but smaller than the small current level, the upper-limit switching unit 121 with minimal current level will be turned on. The end of the first input port 131 that is connected to the turned-on upper-limit switching unit 121 will detect a voltage. The detected voltage is a low-level voltage outputted by the negative electrode of the power module 11, and is recorded as "1" on that end of the first input port 131 connected to the turned-on upper-limit switching unit 121. At this moment, other ends of the first input port 131 are recorded as "0". Hence, the multiplexer module 13 will obtain a data "00000001". Then, a signal is issued from the control end 13e' of the transmission module 14 to the control end 13e of the multiplexer module 13 in order to notify the multiplexer module 13 to lock the data. The clock-out end 13d' of the micro-controller unit 141 will output a clock signal to the clock-in end 13d of the multiplexer module 13 based on a characteristic of the multiplexer module 13. At this time, the output end 13c of the multiplexer module 13 outputs the most significant bit (MSB) of the data "00000001", which is "0", to the input end 13c' of the micro-controller unit 141. As a result, the data on the multiplexer module 13 will shift leftwards by one bit, creating a new data "00000010" on the multiplexer module 13. Then, the micro-controller unit 141 outputs a clock signal to the clock-in end 13d of the multiplexer module 13 again via the clock-out end 13d', enabling the MSB of the data "00000010", which is "0", to be sent to the input end 13c'. Then, the micro-controller unit 141 outputs a clock signal to the clock-in end 13d of the multiplexer module 13 via the clock-out end 13d' again, enabling the output end 13c to send the MSB of the data "00000100", which is "0", to the input end 13c'. Based on this, the micro-controller unit 141 keeps sending clock signals to the clock-in end 13d until all bits of the data are sent to the input end 13c'. As a result, the micro-controller unit 141 will receive a data series: "0", "0", "0", "0", "0", "0", "0" and "1". At this point, a signal is issued from the control end 13e' of the transmission module 14 to the control end 13e of the multiplexer module 13 in order to notify the multiplexer module 13 to unlock the data, enabling the micro-controller unit 141 to receive the data "00000001". Thus, the range of the abnormal current detected by the current detecting module 12 may be determined to be "minimum to small", meaning that the value of the detected abnormal current is between the minimal current level and the small current level.

In another case, assume that there occurs an abnormal current with middle magnitude; in this case, the upper-limit switching units 121 with minimal, small and middle current levels will be turned on. Based on this, the ends of the first input port 131 that are connected to the turned-on upper-limit switching units 121 will detect a voltage. The detected voltage is a low-level voltage outputted by the negative electrode of the power module 11, and is recorded as "1" on those ends of the first input port 131 connected to the turned-on upper-limit switching units 121. At this moment, other ends of the first input port 131 are recorded as "0". Hence, the multiplexer module 13 will obtain a data "00000111". Then, the clock-out end 13d' of the micro-controller unit 141 will output a plurality of clock signals to the clock-in end 13d of the multiplexer module 13. Consequently, the micro-controller unit 141 will receive a data series: "0", "0", "0", "0", "0", "1", "1" and "1" via the input end 13c' thereof, thus completing reception of the data "00000111". Based on this, the range of the abnormal current detected by the current detecting module 12 may be determined to be "middle to large", meaning that the value of the detected abnormal current is between the middle current level and the large current level. The same applies to other abnormal currents with different magnitudes, so they are not described herein for purposes of brevity.

The low-level end S4 and the high-level end S5 are described in detail below.

When the magnitude of the current on the detecting point of each upper-limit switching unit 121 is not higher than the standard value, all the upper-limit switching units 121 will remain OFF. Therefore, the high-level end S5 will detect a high-level voltage (logic "1") outputted by the positive electrode of the power module 11. In this case, the current detecting module 12 will not operate and the low-level end S4 is disabled. In another case, when the magnitude of the current on the detecting point of one upper-limit switching unit 121 is higher than the standard value, the upper-limit switching unit 121 will be turned on. Therefore, the high-level end S5 will detect a low-level voltage (logic "0") outputted by the negative electrode of the power module 11. This indicates that an abnormal current has occurred. Then, the micro-controller unit 141 will immediately determine which current range the abnormal current falls within through the multiplexer module 13. After the current range of the abnormal current is determined, the micro-controller unit 141 will activate the transmission device 142 in order to transmit an error message containing information regarding the current range of the abnormal current to the display unit 2. At the same time, the light-driving end S3 will output currents to drive the lighting module 123. After a predetermined time period, the low-level end S4 will be enabled to detect the switching condition of the lower-limit switching unit 122. Under detection of the enabled low-level end S4, the lower-limit switching unit 122 will be turned on once the current on the detecting point is lower than the standard value of the upper-limit switching unit 121 with minimal current level, but higher than the standard value of the lower-limit switching unit 122. At this moment, the low-level end S4 may detect that the lower-limit switching unit 122 is ON, with the high-level end S5 not being enabled. This causes the light-driving end S3 of the micro-controller unit 141 to stop providing currents to the lighting module 123 so that the lighting module 123 is shut down. Besides, when the magnitude of the current on the detecting point is lower than the standard value and the minimal restore current value, all the upper-limit switching units 121 and the lower-limit switching unit 122 will remain OFF. In this regard, the low-level end S4 and the high-level end S5 will detect a high-level voltage.

Referring to solo FIGURE again, the detection unit 1 and the display unit 2 are described in detail below.

When the power distribution system operates in a normal condition, the current on the detecting point of the power distribution system has a magnitude lower than the standard value, forcing the upper-limit switching units 121 to remain OFF. Therefore, the high-level end S5 of the micro-controller unit 141 will not be triggered via the multiplexer module 13. Thus, the detection unit 1 will not operate. Since the low-level end S4 is not enabled yet in this moment, it is no need to consider the switching condition of the lower-limit switching unit 122. Based on this, in a normal operation, the micro-controller unit 141 only monitors the switching condition of the upper-limit switching unit 121 with minimal current level.

When the power distribution system is broken, an abnormal current will occur. When this happens, the current on the detecting point will have a magnitude higher than the standard value, triggering the upper-limit switching units 121 to turn on. As a result, the micro-controller unit 141 will detect a low-level voltage on the high-level end S5 thereof. Based on the detected low-level voltage, the micro-controller unit 141 will recognize an error and determine within which current range the abnormal current falls. After the current range of the abnormal current has been determined, the micro-controller unit 141 activates the transmission device 142 to issue the error message containing information regarding the current range of the abnormal current to the display unit 2. Then, the light-driving end S3 will output currents for driving the lighting module 123. At the same time, the micro-controller unit 141 enables the low-level end S4 after the high-level end S5 has been enabled for the predetermined time period (2 seconds preferred). Thus, the enabled low-level end S4 will determine whether the power distribution system has gone back to normal operation by detecting whether the abnormal current has been cancelled.

When the power distribution system is broken, the broken circuitry will be isolated from others by a protection mechanism of the power distribution system. When the problem has been fixed, the detecting points of the power distribution system will have normal currents with magnitude lower than the standard value but higher than the minimal restore current value. In this case, once the problem has been fixed, the upper-limit switching units 121 and the lower-limit switching unit 122 will remain OFF. Then, the detecting point will have normal currents so that the lower-limit switching unit 122 is turned on. As a result, the low-level end S4 of the micro-controller unit 141 will detect the low-level voltage so that the detection unit 1 determines that the power distribution system has gone back to normal operation. In response, the micro-controller unit 141 will stop the light-driving end S3 from providing the currents to the lighting module 123 and disable the low-level end S4. Thus, the detection unit 1 is returned to normal condition.

In conclusion, the invention assigns a plurality of current levels "minimum", "small", "middle", "large" and "maximum" for a plurality of upper-limit switching units 121 in order to define five current ranges "minimum to small", "small to middle", "middle to large", "large to maximum" and "over maximum". Based on the defined current ranges, the range which an abnormal current falls within may be determined. Then, the detection unit 1 will automatically detect whether a normal current is available via the multiplexer module 13 and the micro-controller unit 141. If so, the detection unit 1 is returned to normal condition.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A current detecting and indicating device for a power distribution system, comprising:

a detection unit having a power module, a current detecting module, a multiplexer module and a transmission module, wherein the power module includes positive and negative electrodes and is coupled to the current detecting module, the current detecting module includes a plurality of upper-limit switching units and a lower-limit switching unit, each of the upper-limit switching units has two ends coupled to the positive and negative electrodes, the lower-limit switching unit has two ends coupled to the positive and negative electrodes, the multiplexer module includes a first input port and a first output port, wherein the first input port is coupled to the upper-limit switching units, the first output port is coupled to the transmission module, the transmission module includes a micro-controller unit and a transmission device coupled to the micro-controller unit, the micro-controller unit includes a low-level end, a high-level end and a second input port, the low-level end is coupled to the lower-limit switching unit, the high-level end is coupled to one of the upper-limit switching units with minimal current level, and the second input port is coupled to the first output port; and a display unit coupled to the transmission device for receiving signals therefrom.

2. The current detecting and indicating device for the power distribution system as claimed in claim 1, wherein each of the upper-limit switching units consists of a magnetic reed switch and a resistor, and the lower-limit switching unit consists of a magnetic reed switch and a resistor.

3. The current detecting and indicating device for the power distribution system as claimed in claim 2, wherein the first input port includes a plurality of ends, each being connected to a node where the magnetic reed switch and the resistor of a respective one of the upper-limit switching units are connected together.

4. The current detecting and indicating device for the power distribution system as claimed in claim 2, wherein the low-level end is coupled to a node where the magnetic reed switch and the resistor of the lower-limit switching unit are connected together, and the high-level end is coupled to a node where the magnetic reed switch and the resistor of one of the upper-limit switching units are connected together.

5. The current detecting and indicating device for the power distribution system as claimed in claim 2, wherein the second input port includes an input end, a clock-out end and a control end.

6. The current detecting and indicating device for the power distribution system as claimed in claim 5, wherein the first output port includes an output end, a clock-in end and a control end, the input end is coupled to the output end, the clock-out end is coupled to the clock-in end, and the control end of the second input port is coupled to the control end of the first output port.

7. The current detecting and indicating device for the power distribution system as claimed in claim 1, wherein a node where the magnetic reed switch and the resistor of each of the upper-limit switching units are connected together is connected to the multiplexer module.

8. The current detecting and indicating device for the power distribution system as claimed in claim 1, wherein the first output port includes an output end, a clock-in end and a control end, and the output end, the clock-in end and the control end are coupled to the transmission module.

9. The current detecting and indicating device for the power distribution system as claimed in claim 1, wherein the upper-limit switching units and the lower-limit switching unit are coupled between the positive and negative electrodes.

10. The current detecting and indicating device for the power distribution system as claimed in claim 1, wherein the multiplexer module is chosen as a multiple-bit register according to a current range of an abnormal current to be detected.

11. The current detecting and indicating device for the power distribution system as claimed in claim 10, wherein the multiple-bit register is a 8-bit register.

12. The current detecting and indicating device for the power distribution system as claimed in claim 1, wherein the transmission device is a Zigbee, a general packet radio service, a global system for mobile communications, a power line carrier or a fiber network.

13. The current detecting and indicating device for the power distribution system as claimed in claim 1, wherein the upper-limit switching units are turned on according to different current levels.

14. The current detecting and indicating device for the power distribution system as claimed in claim 1, further comprising a lighting module having one end coupled to the negative electrode of the power module and the other end coupled to the transmission module.

* * * * *